(12) United States Patent
Kim et al.

(10) Patent No.: US 6,262,928 B1
(45) Date of Patent: Jul. 17, 2001

(54) PARALLEL TEST CIRCUIT AND METHOD FOR WIDE INPUT/OUTPUT DRAM

(75) Inventors: Juhan Kim, Cupertino; Hing Wong, Los Altos, both of CA (US)

(73) Assignee: Silicon Access Networks, Inc., San Jose, CA (US)

( * ) Notice: Subject to any disclaimer, the term of this patent is extended or adjusted under 35 U.S.C. 154(b) by 0 days.

(21) Appl. No.: 09/661,165

(22) Filed: Sep. 13, 2000

(51) Int. Cl.[7] ................................................... G11C 29/00
(52) U.S. Cl. ........................................ 365/201; 365/189.04
(58) Field of Search ................................... 365/201, 200, 365/185.04, 230.04, 189.04

(56) References Cited

U.S. PATENT DOCUMENTS 5,400,344 * 3/1995 Mori ...................... 365/201
5,610,866 * 3/1997 McClure .................. 365/201

* cited by examiner

*Primary Examiner*—Tan T. Nguyen
(74) *Attorney, Agent, or Firm*—Fernandez & Associates, LLP

(57) ABSTRACT

The present invention discloses a parallel test circuit and method for testing even bit line and odd bit line in a memory block simultaneously. The parallel test circuit comprises an even test circuit for testing an even bit line and an odd test circuit for testing an odd bit line. The parallel test circuit also includes a write circuit for writing data to a bit line, a read circuit including a data sense amp, an output buffer, and a comparator. Furthermore, the present invention provides the capability to conduct disturbance test in neighboring even and odd cells.

8 Claims, 6 Drawing Sheets

PARALLEL TEST CIRCUIT AND METHOD FOR WIDE INPUT/OUTPUT DRAM

BACKGROUND INFORMATION

1. Field of the Invention

The present invention relates generally to the field of integrated circuits, and particularly Dynamic Random-Access Memories (DRAMs).

2. Description of Related Art

Networking companies are scrambling in a race to design and develop high performance network processing products for the terabit router market while reducing the cost to implement 10 giga-bits per second/OC192 and above optical carrier network interfaces. Terabit routers demand a fatter throughput of data packets for examining an incoming packet, retrieves a next hop location, and transfers the packet to destination. Memory chips serve as integral components in building a fast network infrastructure.

FIG. 1 is a circuit diagram illustrating a conventional parallel test mode circuit diagram. An odd memory cell 11a is coupled between sense amps 11b and sense amps 11c. Signals generated from sense amps 11b and 11c are coupled to a global parallel data bus 11d and a read/write control signal 11e, which further couples to a global parallel input/output (IO) 11f. Similarly, an even memory cell 12a is coupled between sense amps 12b and sense amps 12c. Signals generated from sense amps 12b and 12c are coupled to a global parallel data bus 12d and a read/write control signal 12e, which further couples to a global parallel IO 12f. A main IO 13 couples between global parallel IOs 11e and 12e, and multiple external IOs 14a, 14b, 14c, and 14d. A control circuit 15 receives RAS/CAS/read/write signal 16 and address inputs 17 for activating test signals 18a and 18b or read/write signal 11e and 12e. A shortcoming of this conventional circuit 10 is that there is limited number of IOs, which impose restrictions in expanding and tiling the number of IOs. The conventional circuit 10 also is not able to generate the disturbance test pattern in parallel for testing a neighboring memory cell.

Accordingly, it is desirable to have a DRAM circuit that efficiently performs parallel test of memory cells.

SUMMARY OF THE INVENTION

The present invention discloses a parallel test circuit and method for testing even bit line and odd bit line in a memory block simultaneously, preferably within the one clock cycle. The parallel test circuit comprises an even test circuit for testing an even bit line and an odd test circuit for testing an odd bit line. The parallel test circuit also includes a write circuit for writing data to a bit line, a read circuit including a data sense amp, an output buffer, and a comparator. Furthermore, the present invention provides the capability to conduct disturbance test in neighboring even and odd cells.

For example, in 16 bit lines, a write circuit writes the same data to each bit line. The comparator in the read circuit compares all 16 bits in the memory array to generate an output high when all data are identical, and generate an output low when data in of the bits fails to match with other bits in the memory array.

In one embodiment, the memory structure is implemented with a set of even sense amps from the bottom and a set of odd sense amps from the top, or vice versa. Consequently, this design advantageously places an even bit line adjacent to an odd bit line in opposite direction. Preferably, the even and odd bit lines hold different logic values, such as logic "0" in an even bit line and a logic "1" in an odd bit line. This structure provides the ability to determine the amount of interference or noise between the two adjacent even and odd bit lines. Additionally, since bits lines are connected to memory cells, the amount of interference or noise injected can be determined between adjacent memory cells.

Advantageously, the present invention enables the capability to test for interferences that are divided into even and odd bit line groups.

DETAILED DESCRIPTION OF PREFERRED EMBODIMENTS

Figure 1:
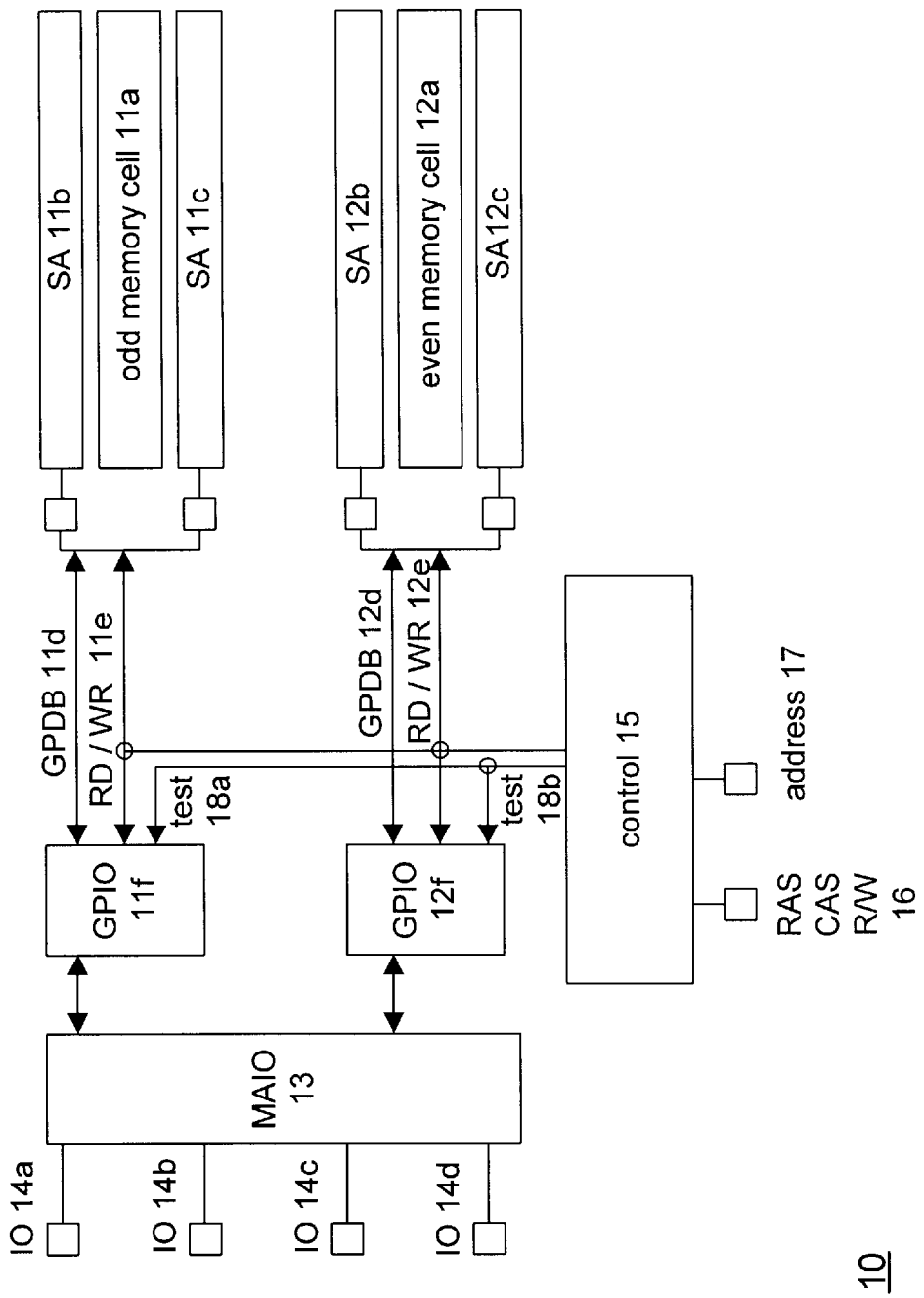
FIG. 1 is a prior art circuit diagram illustrating a convention parallel test mode circuit diagram.
Figure 2:
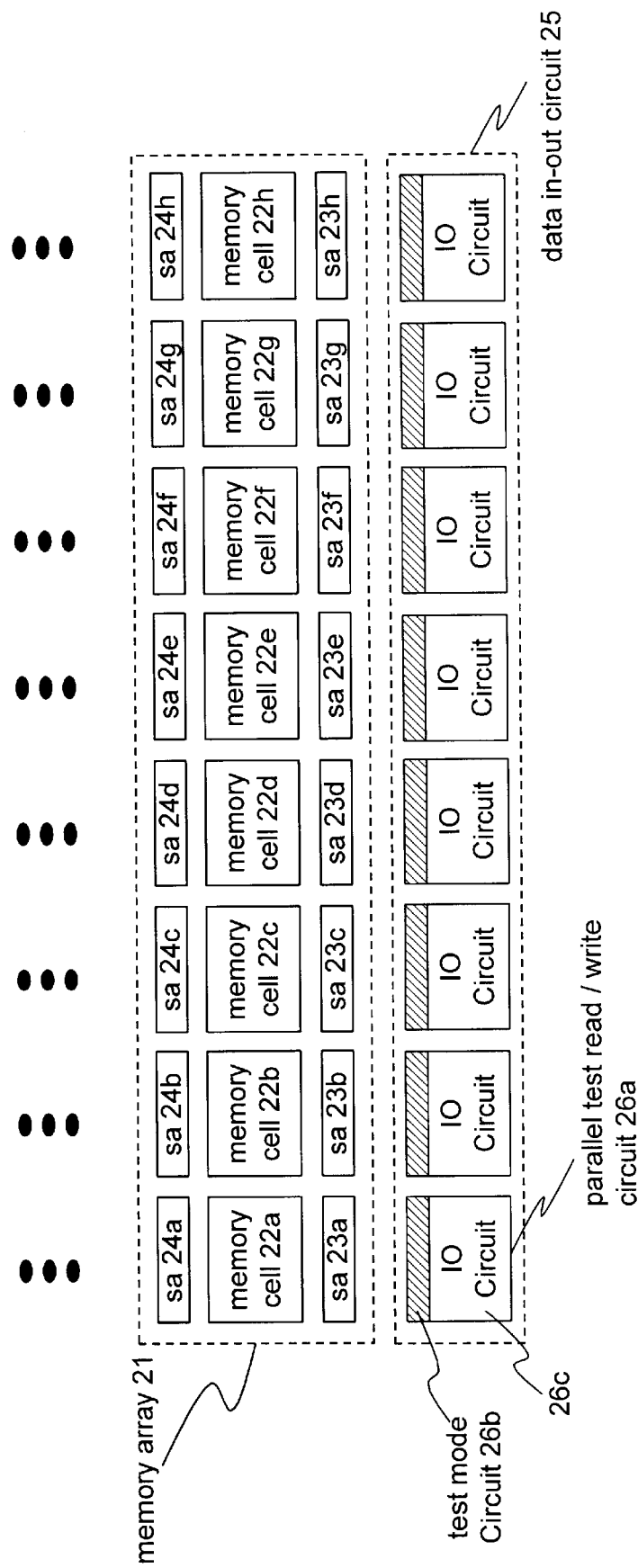
FIG. 2 is a floor plan diagram illustrating a parallel test circuit in accordance with the present invention.

FIG. 2 is schematic diagram illustrating a memory structure 20 including a memory array 21, and a data input/output circuit 25. One of ordinary skill in the art should recognize that additional memory arrays may be stacked over the memory array 21. In the memory array 21 comprises multiple memory cells 22a–h, where each memory cell is aligned with a corresponding one of sense amps 23a–h below and is aligned with a corresponding one of sense amps 24a–h on top. The data input/output circuit 25 is constructed with multiple numbers of parallel test read/write circuits, where each parallel test read/write circuit has a test mode circuit and an IO circuit. For example, the parallel test circuit 26a includes a test mode circuit 26b and an IO circuit 26c. The parallel test read/write circuit 26a provides the capability to test the validity of memory bits in the memory cell 21 by processing the testing of an even bit and an odd bit in parallel.

Figure 3:
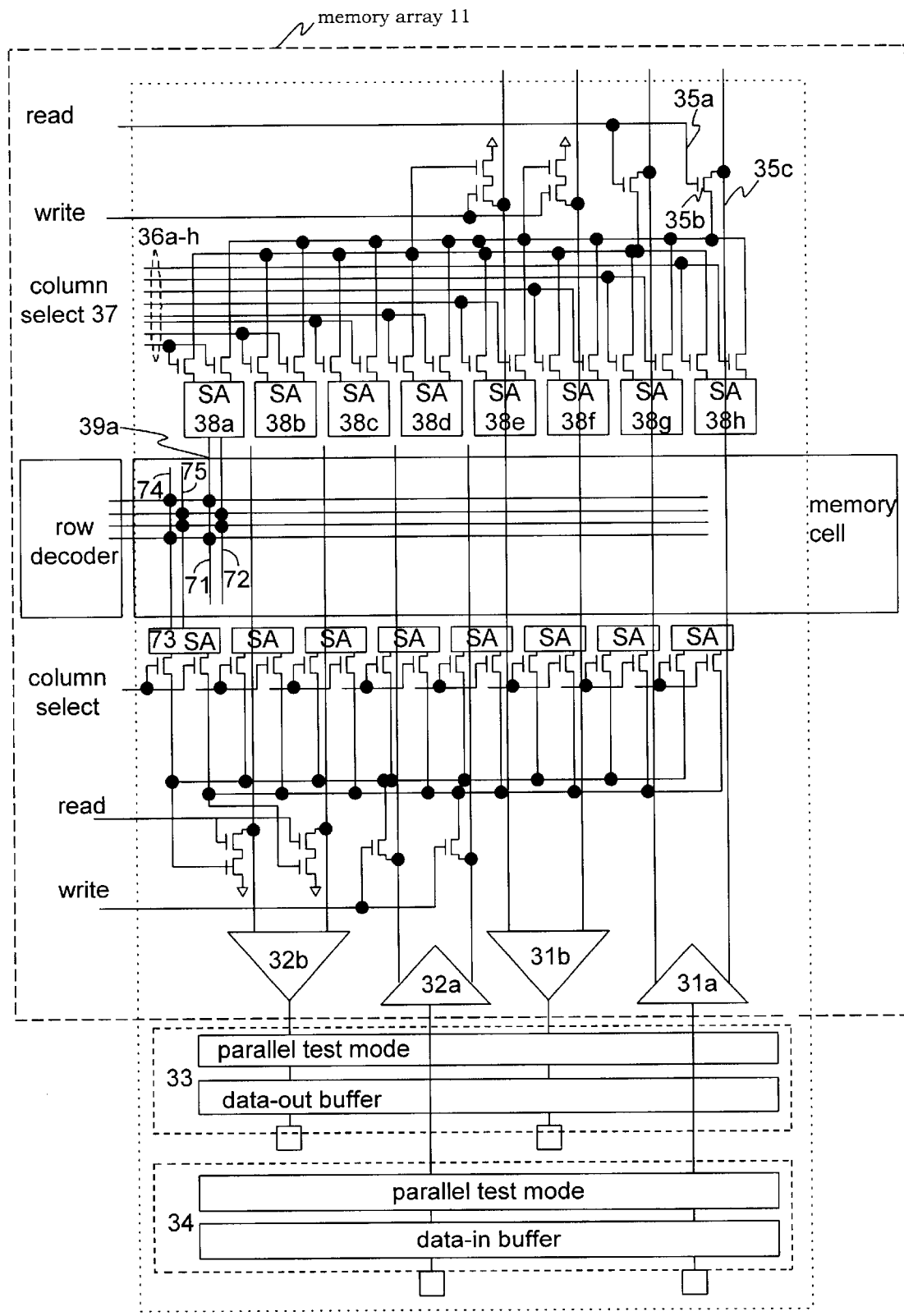
FIG. 3 is a schematic diagram illustrating a parallel test circuit in accordance with the present invention.

FIG. 3 is a detailed schematic diagram illustrating a parallel test circuit 30, which includes the memory array 21, data write drivers 31a and 32a, data read drivers 31b and 32b, a read circuit 33, and a write circuit 34. When a write line 35a is turned ON, then a transistor 35b is in turn switched ON to activate a write global line 35c. The write global line 35c in turn is connected to eight decoded lines 36a–h. A column select 37 enables one of the eight sense amps 38a–h that correspond to one of the eight decoded lines 36a–h. Each of the sense amps 38a–h is connected to a pair of outputs of a local bit line. For the write global bit line 35c, when a sense amp in sense amps 38a–h is activated, a local bit line 39a is turn ON.

The sense amp 38a, or an upper sense amp, connects to bit lines 71 and 72. A sense amp 73, or a lower sense amp, connects to bit lines 71 and 75. If the sense amp 38a is an even sense amp, and the sense amp 73 is an odd sense amp, then the even group of bit lines 71 and 72, and the odd group of bit lines 74 and 75 can be tested in parallel in a test mode.

In addition, the opposite data can be stored between even and odd bit lines. A first test circuit for testing an even bit extends in a first direction; and a second test circuit, coupled to the first test circuit, for testing an odd bit extends in a second direction, where the first direction and the second direction being opposite with one another.

Figure 4:
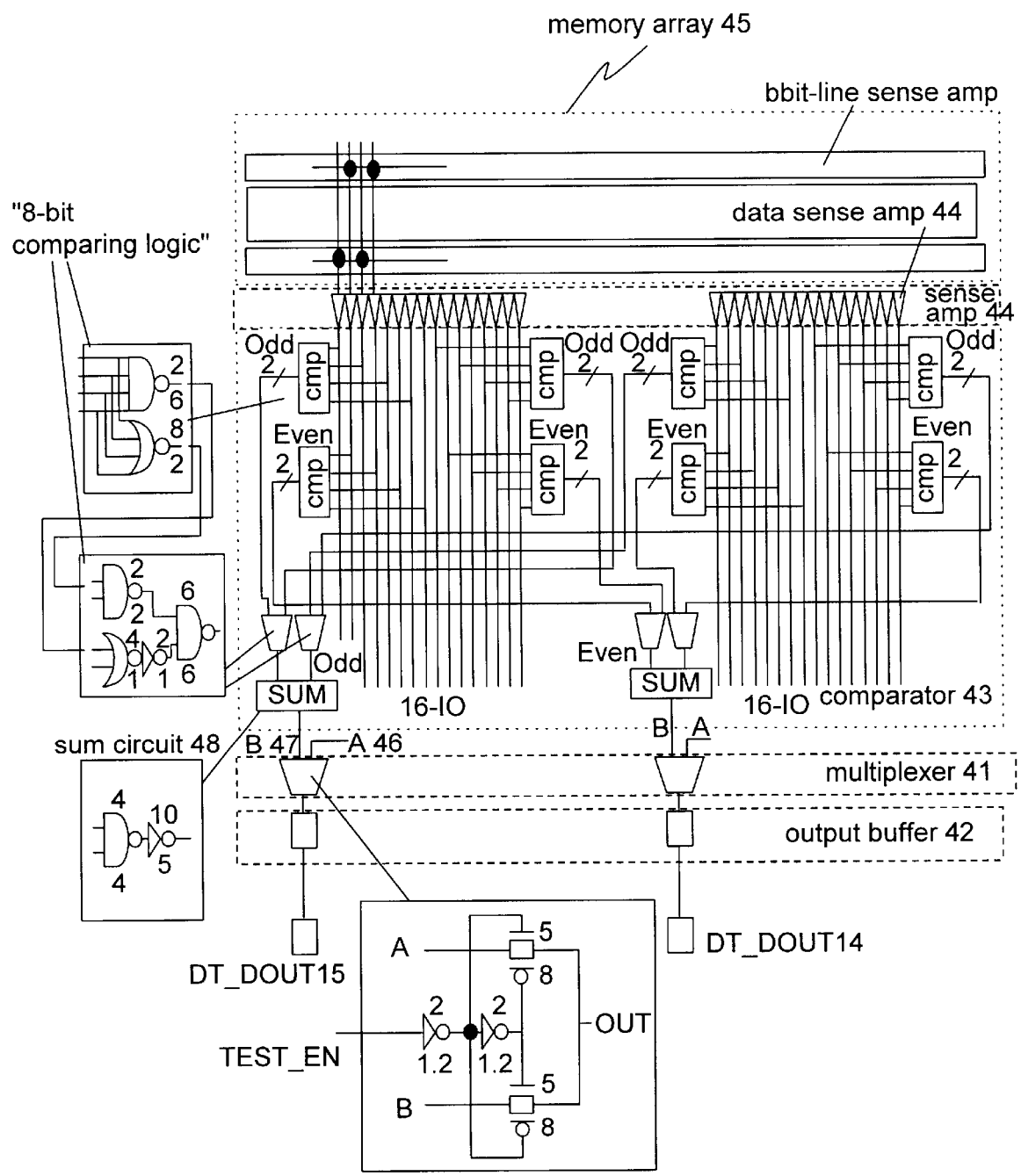
FIG. 4 is a schematic diagram illustrating a read cycle in a parallel test circuit in accordance with the present invention.

FIG. 4 is a schematic diagram illustrating a parallel test read circuit 40, including a multiplexer 41, an output buffer 42, a comparator 43, a data sense amp 44, a memory array 45. To illustrate an example, an even data is transmitted to a data sense amp 44, which generates an output to a comparator that couples to another comparator. The output from the comparator is sent to an input of a sum circuit 48. The multiplexer 41 selects from input A 46 or input B 47 to generate a high output, representing that all 16 bits contains the identical data. Conversely, if the output from the multiplexer 41 is low, then there is a discrepancy between the values of data in the 16 bit.

An 8-bit comparator logic is shown in magnified view on the side. Each of the comparator circuit compares 4 bits of data. Cumulatively, four comparators are used for comparing all 16 bits of data. One of ordinary skill in the art should recognize that this is simply one circuit configuration for implementing the read circuit, and various modifications can be practiced within the spirits of the invention.

Figure 5:
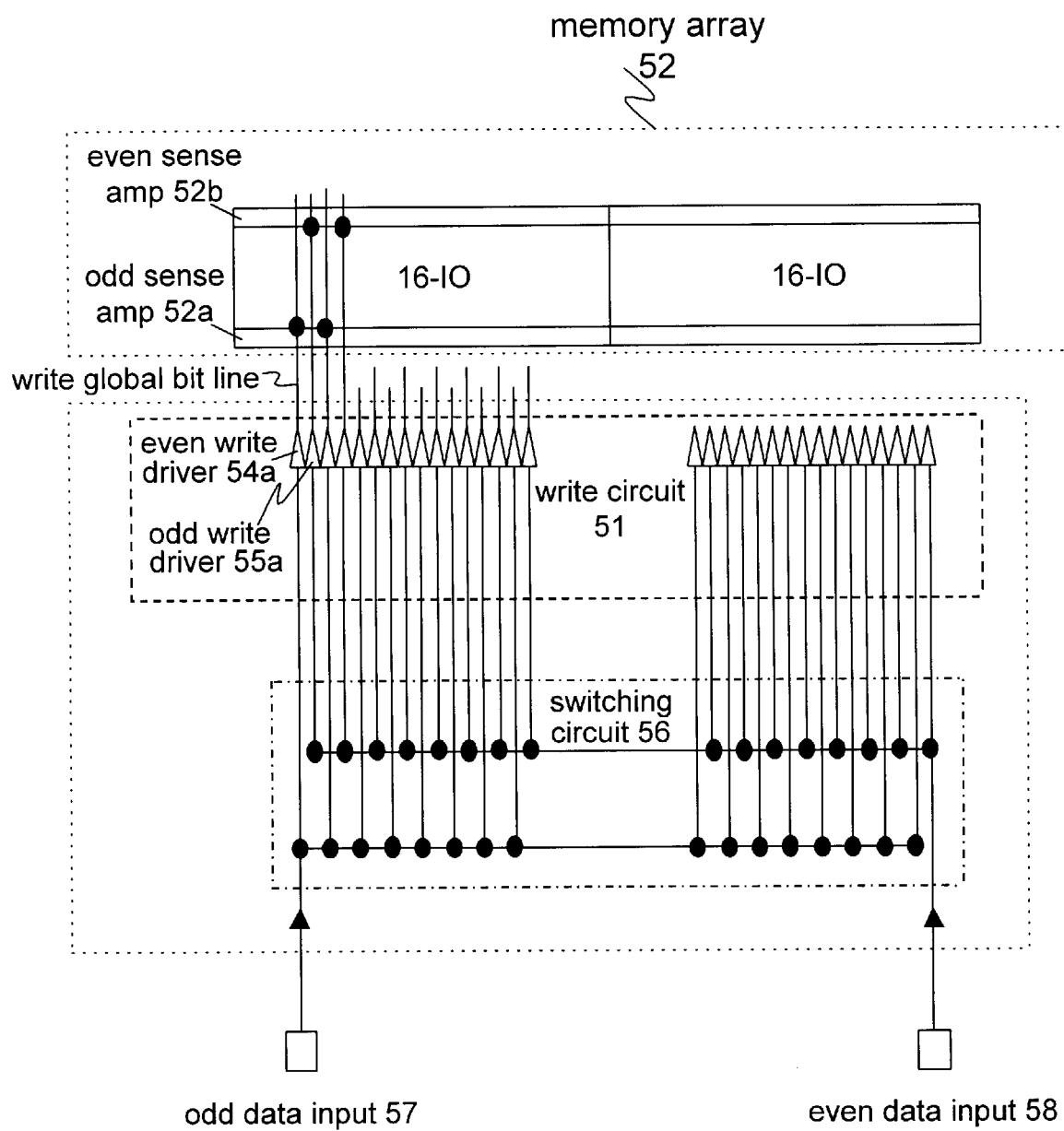
FIG. 5 is a schematic diagram illustrating a write cycle in a parallel test circuit in accordance with the present invention.

FIG. 5 is a schematic diagram illustrating a write cycle in a parallel test circuit 50, including a write circuit 51 and an memory array 52. The memory array 52 is structured with even sense amps 52b on the top and odd sense amp 52a on the bottom. Adjacent to the memory array, the memory array 52 couples alternately to odd sense amp 52a at the bottom and even sense amps 52b at the top. Additional memory cell arrays can be extended with alternative sense amp order attached to the memory array 52 to suit a circuit design. For illustration, the write circuit 51 further comprises an even write driver 54a, an odd write driver 55a, switching points 56, an odd data input 57, an even data input 58. The memory array 52 further comprises odd sense amp 52a, even sense amp 52b, a memory cell array 52 with 32 global bit lines or data. The memory array 52a is coupled to the write circuit with write global bit lines.

Figure 6:
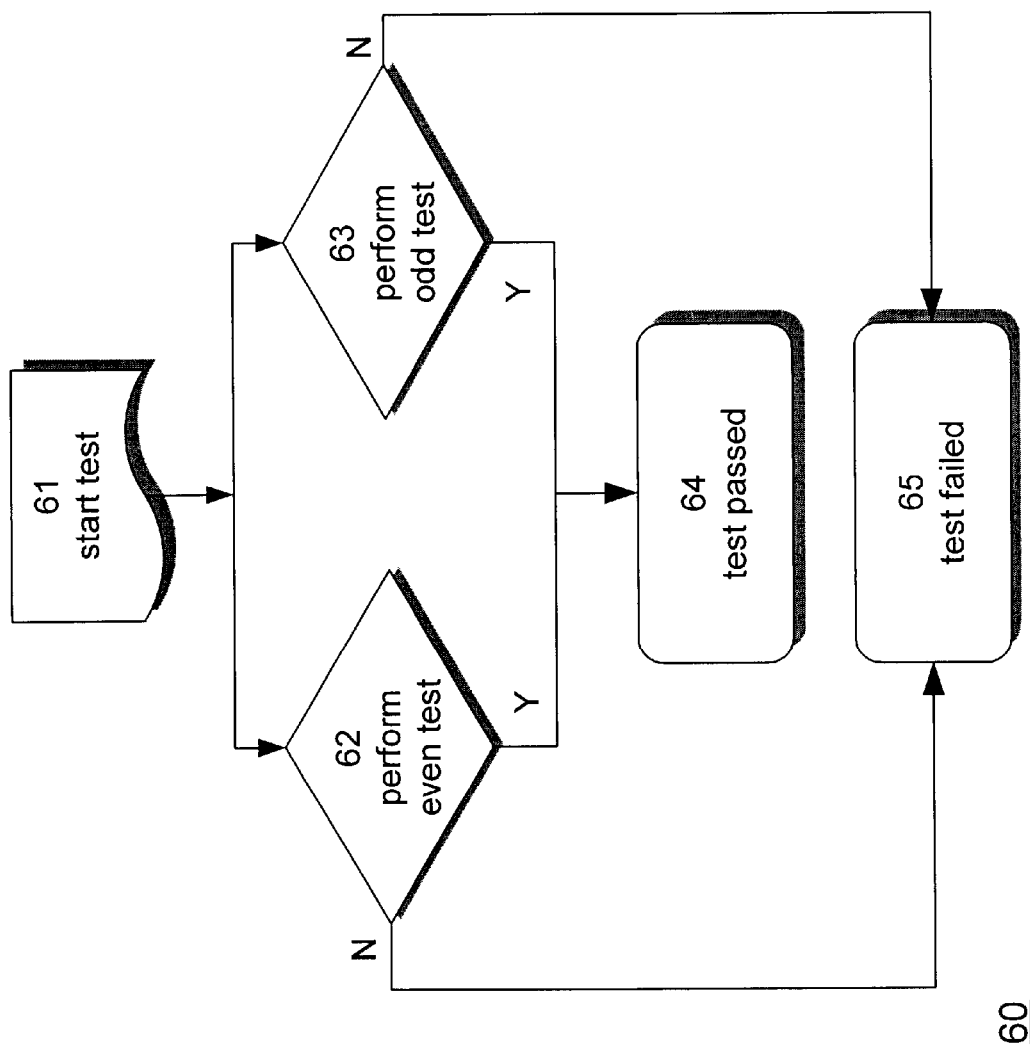
FIG. 6 is a flow diagram illustrating the process of performing a parallel test in accordance with the present invention.

FIG. 6 is flow diagram illustrating the process 60 to performing parallel testing of even and odd bits. The parallel test read/write circuit 30 starts 61 in testing memory cells. The parallel test read/write circuit 60 performs 62 of even test simultaneously with testing 63 of odd test. On the one hand, if a low output is generated from the read/write circuit 60, the result is a failed test in an operation 65. On the other hand, if an output from the read/write circuit 60 is a high, then the testing has successfully passed in an operation 64.

Foregoing described embodiments of the invention are provided as illustrations and descriptions. They are not intended to limit the invention to precise form described. In particular, Applicants contemplate that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by Claims following.

We claim:

1. An integrated circuit for testing an even bit line and an odd bit line, comprising:

a first test circuit for testing an even bit extending in a first direction; and a second test circuit, coupled to the first test circuit, for testing an odd bit extending in a second direction, the first direction and the second direction being opposite with one another, the second test circuit testing bit in parallel with the first test circuit testing the even bit.

2. The integrated circuit of claim 1 wherein the even bit line and the odd bit line is resident in a memory array.

3. The integrated circuit of claim 1 further comprise an output of a first sense amp coupled to the even bit line, and an output of a second sense amp coupled to the odd bit line.

4. The integrated circuit of claim 1 wherein the even bit line comprises a local bit line.

5. The integrated circuit of claim 1 wherein the odd bit line comprises a local bit line.

6. A method for testing an even bit line and an odd bit line, comprising the steps of:

testing an even bit in a memory extending in a first direction; and testing an odd bit in the memory in parallel extending in a second direction; a first test circuit for testing an even bit extending in a first direction, the first direction and the second direction being opposite with one another.

7. The integrated circuit of claim 6, further comprising the step of generating a pass test signal if the testing of even and odd bits resulting in a pass.

8. The integrated circuit of claim 1, further comprising the step of generating a failed test signal if either one of testing even or odd bit resulting in a fail.

* * * * *